United States Patent
Tanaka et al.

(10) Patent No.: US 9,431,260 B2
(45) Date of Patent: Aug. 30, 2016

(54) SEMICONDUCTOR DEVICE AND MANUFACTURING METHOD OF THE SAME

(71) Applicant: TOYODA GOSEI CO., LTD., Kiyosu-shi (JP)

(72) Inventors: Nariaki Tanaka, Kiyosu (JP); Tohru Oka, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/563,943

(22) Filed: Dec. 8, 2014

(65) Prior Publication Data

US 2015/0162208 A1  Jun. 11, 2015

(30) Foreign Application Priority Data

Dec. 11, 2013 (JP) ................. 2013-255772

(51) Int. Cl.
*H01L 21/306* (2006.01)
*H01L 21/324* (2006.01)

(52) U.S. Cl.
CPC ..... *H01L 21/30621* (2013.01); *H01L 21/3245* (2013.01)

(58) Field of Classification Search
None
See application file for complete search history.

(56) References Cited

U.S. PATENT DOCUMENTS

| | | | | |
|---|---|---|---|---|
| 4,733,374 A | * | 3/1988 | Furuyama | G11C 8/14 365/149 |
| 5,055,418 A | * | 10/1991 | Vora | H01L 21/82285 148/DIG. 10 |
| 5,502,323 A | * | 3/1996 | Kitamura | H01L 23/5226 257/335 |
| 6,121,633 A | * | 9/2000 | Singh | H01L 29/1608 257/212 |
| 2001/0005031 A1 | * | 6/2001 | Sakamoto | H01L 29/0634 257/401 |
| 2003/0042549 A1 | * | 3/2003 | Fujihira | H01L 29/0634 257/378 |
| 2004/0096997 A1 | * | 5/2004 | Kwak | H01L 33/32 438/22 |
| 2004/0184493 A1 | * | 9/2004 | Yamanaka | H01S 5/02272 372/36 |
| 2006/0220044 A1 | * | 10/2006 | Sugawara | H01L 21/02389 257/96 |
| 2010/0248399 A1 | * | 9/2010 | Hsieh | H01L 27/14634 438/15 |
| 2012/0128375 A1 | * | 5/2012 | Kimoto | G02B 6/12004 398/201 |
| 2012/0266949 A1 | * | 10/2012 | Blakers | H01L 31/02168 136/256 |
| 2013/0308667 A1 | * | 11/2013 | Hagino | H01S 5/02469 372/36 |
| 2014/0131837 A1 | * | 5/2014 | Nie | H01L 29/42304 257/565 |
| 2014/0191369 A1 | | 7/2014 | Tsuchiya et al. | |

FOREIGN PATENT DOCUMENTS

| | | |
|---|---|---|
| JP | 2540791 B | 10/1996 |
| JP | 3344257 B | 11/2002 |
| JP | 3509514 B | 3/2004 |
| JP | 2010-062381 A | 3/2010 |
| JP | 2012-084617 A | 4/2012 |

* cited by examiner

*Primary Examiner* — Allan Olsen
(74) *Attorney, Agent, or Firm* — McGinn IP Law Group, PLLC

(57) ABSTRACT

There is provided a manufacturing method of a semiconductor device having an N-type semiconductor layer on a P-type semiconductor layer. The manufacturing method comprises: a dry etching process of performing dry etching to go through the N-type semiconductor layer in a thickness direction and make the plane in the thickness direction of the P-type semiconductor layer exposed; and a annealing process of annealing the P-type semiconductor layer in an atmosphere containing oxygen, after the dry etching process. This manufacturing method improves the electrical properties of the P-type semiconductor layer.

14 Claims, 6 Drawing Sheets

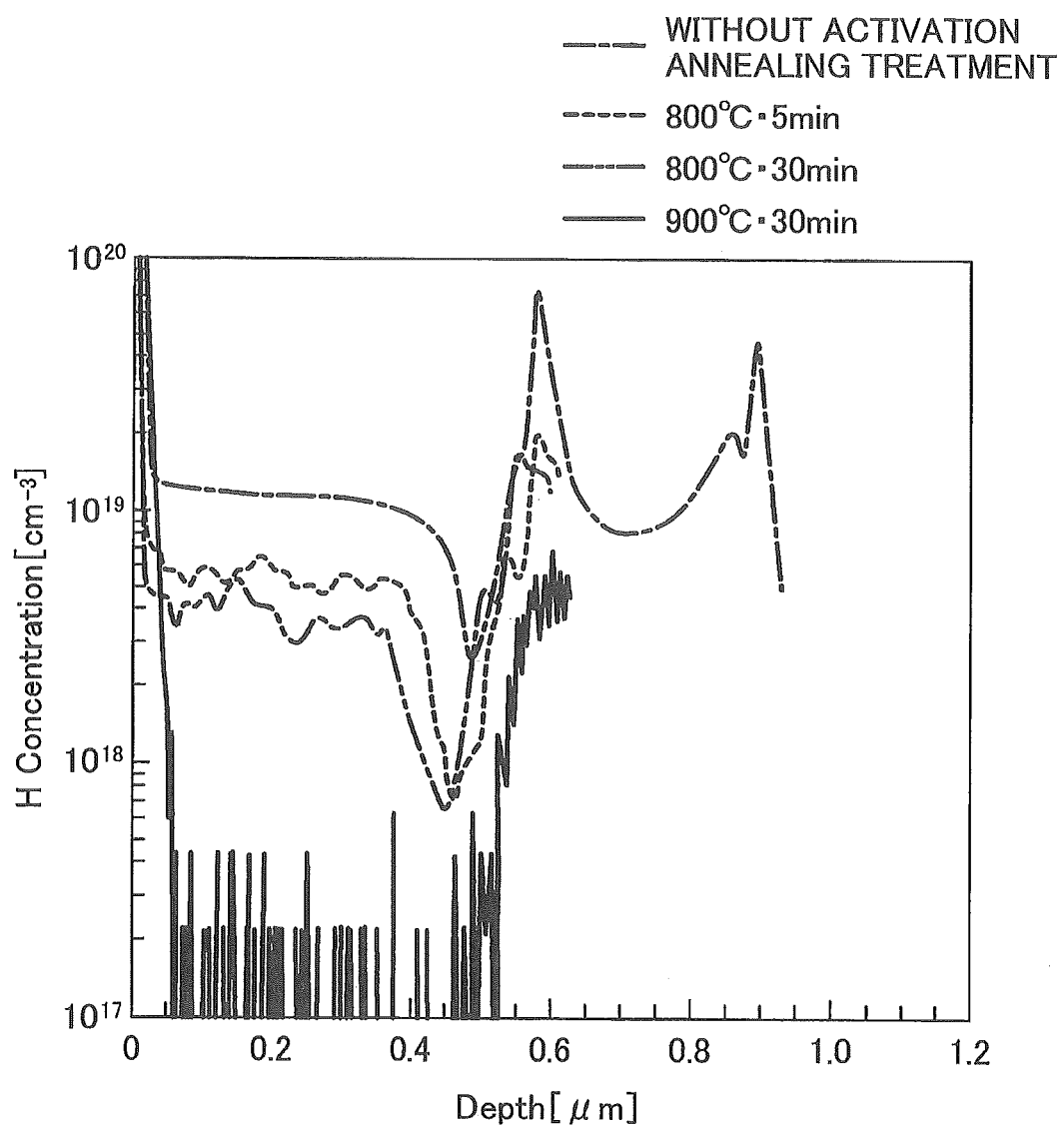

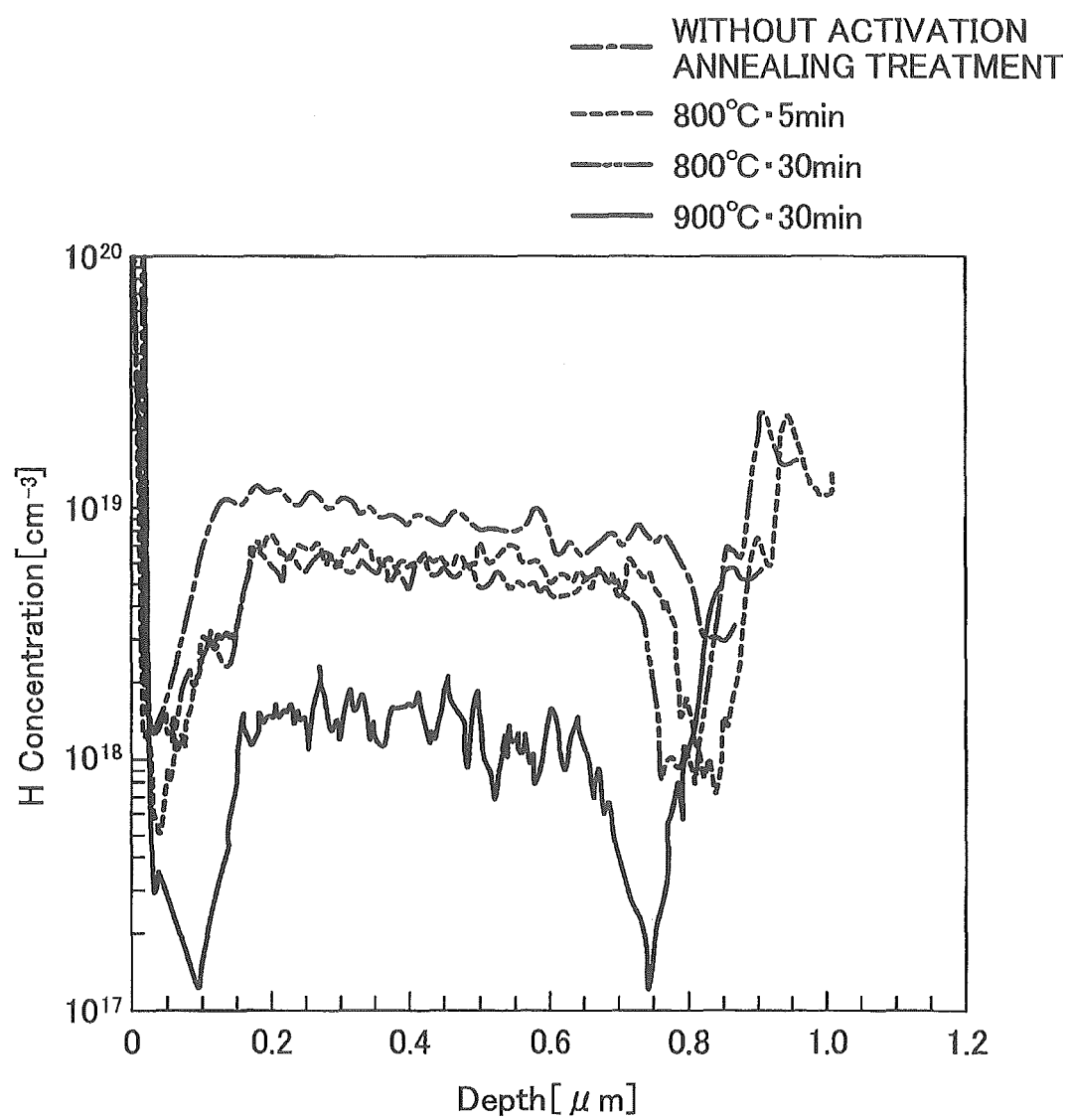

SEMICONDUCTOR DEVICE AND MANUFACTURING METHOD OF THE SAME

CROSS-REFERENCE TO RELATED APPLICATION

The present application claims priority from Japanese patent applications No. 2013-255772 filed on Dec. 12, 2013, the entirety of disclosures of which is hereby incorporated by reference into this application.

TECHNICAL FIELD

The present invention relates to a semiconductor device.

DESCRIPTION OF THE RELATED ART

One known structure of a semiconductor device is a stacked structure where a P-type GaN layer (called "second layer") is stacked on an N-type GaN layer (called "first layer") and another N-type GaN layer (called "third layer") is stacked on the P-type GaN layer (second layer) (for example, JP 2010-62381A).

This known structure, however, has a problem that inclusion of H (hydrogen atom) in the course of growing the P-type GaN layer (second layer) results in an insufficient hole concentration. A method proposed to solve this problem performs dry etching from the n-type GaN layer of the third layer to the N-type GaN layer of the first layer, subsequently performs wet etching and then performs annealing treatment to remove H in the P-type GaN layer (second layer) (for example, JP 2010-62381A).

SUMMARY

This proposed method, however, needs the etching process twice (dry etching and wet etching) and accordingly has an increase in manufacturing cost. This problem is not limited to the semiconductor device using the GaN layer but is commonly found in all semiconductor devices. Other needs over the prior art semiconductor device include decrease of the resistance, downsizing of the device, resource saving, simplification of manufacture, accuracy of manufacture and improvement of workability.

In order to solve at least part of the problems described above, the present invention is implemented by any of aspects and embodiments described below.

According to one aspect of the invention, there is provided a manufacturing method of a semiconductor device. The manufacturing method of a semiconductor device has an N-type semiconductor layer on a P-type semiconductor layer, the manufacturing method comprises: a dry etching process of performing dry etching to go through the N-type semiconductor layer in a thickness direction and make a plane in the thickness direction of the P-type semiconductor layer exposed; and a annealing process of annealing the P-type semiconductor layer in an atmosphere containing oxygen, after the dry etching process. This aspect enables hydrogen atom (H) to be efficiently removed via the exposed area in the annealing process without requiring wet etching after dry etching and before anneal treatment. Accordingly, this ensures sufficient enhancement of the hole concentration of the P-type semiconductor layer. As a result, this improves the electrical properties of the P-type semiconductor layer which has been subjected to dry etching in the semiconductor device.

In the manufacturing method of the semiconductor device of the above aspect, the P-type semiconductor layer and the N-type semiconductor layer may be mainly made of gallium nitride. This aspect sufficiently enhances the hole concentration of the P-type semiconductor layer, while reducing the manufacturing cost.

In the manufacturing method of the semiconductor device of the above aspect, a width of the P-type semiconductor layer exposed by the dry etching process may be not less than 1% of a half pitch of the semiconductor device. This aspect sufficiently enhances the hole concentration of the P-type semiconductor layer, while reducing the manufacturing cost.

In the manufacturing method of the semiconductor device of the above aspect, a width of the P-type semiconductor layer exposed by the dry etching process may be not less than 1 µm. This aspect sufficiently enhances the hole concentration of the P-type semiconductor layer, while reducing the manufacturing cost.

In the manufacturing method of the semiconductor device of the above aspect, a half pitch of the semiconductor device may be not greater than 10 µm. This aspect sufficiently enhances the hole concentration of the P-type semiconductor layer, while reducing the manufacturing cost.

In the manufacturing method of the semiconductor device of the above aspect, the annealing process may have a annealing temperature of not lower than 800° C. and a annealing time of not shorter than 5 minutes and not longer than 60 minutes. This aspect sufficiently enhances the hole concentration of the P-type semiconductor layer, while reducing the manufacturing cost.

In the manufacturing method of the semiconductor device of the above aspect, the plane in the thickness direction of the P-type semiconductor layer exposed by the dry etching process may be c plane. This aspect sufficiently enhances the hole concentration of the P-type semiconductor layer, while reducing the manufacturing cost.

According to another aspect of the invention, there is provided a semiconductor device. The semiconductor device manufactured by the manufacturing method of the semiconductor device of the above aspect, an average concentration of hydrogen atom relative to an average concentration of a P-type impurity in the P-type semiconductor layer is not higher than 65%. This aspect sufficiently enhances the hole concentration of the P-type semiconductor layer, while reducing the manufacturing cost.

In the semiconductor device of the above aspect, the P-type impurity may be magnesium. This aspect sufficiently enhances the hole concentration of the P-type semiconductor layer, while reducing the manufacturing cost.

All the plurality of components included in the aspect of the invention described above are not essential, but some components among the plurality of components may be appropriately changed, omitted or replaced with other components or part of the limitations may be deleted, in order to solve part or all of the problems described above or in order to achieve part or all of the advantageous effects described herein. In order to solve part or all of the problems described above or in order to achieve part or all of the advantageous effects described herein, part or all of the technical features included in one aspect of the invention described above may be combined with part or all of the technical features included in another aspect of the invention described later to provide still another independent aspect of the invention.

The invention may be implemented any of various aspects other than the semiconductor device and the manufacturing method of the semiconductor device described above. Such other aspects for implementing the invention include, for example, an electric device having the semiconductor device of the above aspect incorporated therein and a manufacturing apparatus for manufacturing the semiconductor device of the above aspect.

BRIEF DESCRIPTION OF DRAWINGS

FIG. 6 is a graph showing a relationship between the depth and H concentration; and FIG. 7 is a graph showing a relationship between the depth and H concentration.

DESCRIPTION OF EMBODIMENTS

A. First Embodiment

A1. Structure of Semiconductor Device

Figure 1:
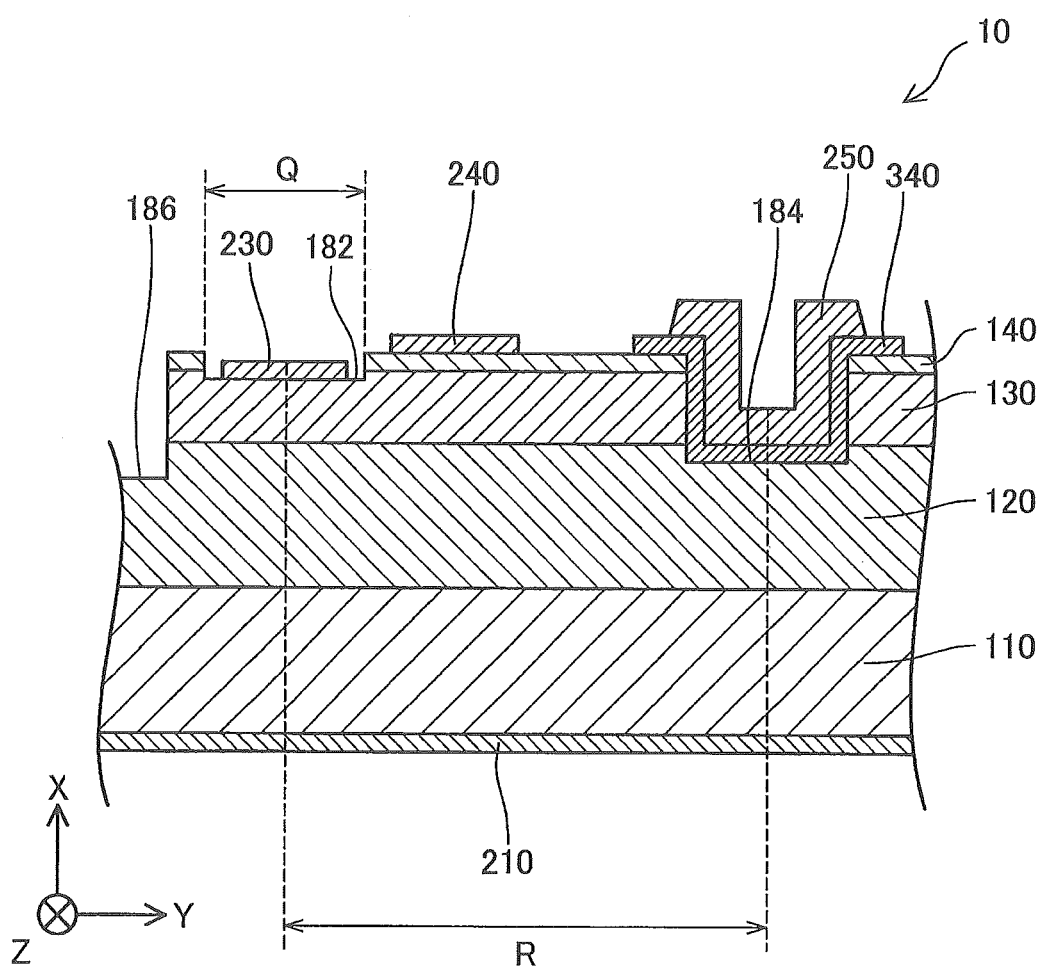
FIG. 1 is a cross sectional view schematically illustrating the structure of a semiconductor device according to a first embodiment.

FIG. 1 is a cross sectional view schematically illustrating the structure of a semiconductor device 10 according to a first embodiment. The semiconductor device 10 is a GaN-based semiconductor device formed by using gallium nitride (GaN). According to this embodiment, the semiconductor device 10 is used for power control and is also called power device or high-frequency device.

The semiconductor device 10 includes a substrate 110, an N-type semiconductor layer 120, a P-type semiconductor layer 130, another N-type semiconductor layer 140, electrodes 210, 230, 240 and 250 and an insulating film 340. The semiconductor device 10 is an NPN-type semiconductor device and has a structure in which the N-type semiconductor layer 120, the P-type semiconductor layer 130 and the N-type semiconductor layer 140 are joined sequentially.

The N-type semiconductor layer 120, the P-type semiconductor layer 130 and the N-type semiconductor layer 140 of the semiconductor device 10 are semiconductor layers formed by crystal growth according to metal organic chemical vapor deposition (MOCVD). The semiconductor device 10 has a concavity 182, a concavity 184 and a concavity 186 formed by dry etching.

FIG. 1 shows XYZ axes which are orthogonal to one another. Among the XYZ axes of FIG. 1, the X axis denotes an axis along a stacking direction in which the N-type semiconductor layer 120 is stacked on the substrate 110. With respect to an X-axis direction along the X axis, +X-axis direction is a direction going from the substrate 110 toward the N-type semiconductor layer 120; and –X-axis direction is a direction opposite to the +X-axis direction. Among the XYZ axes of FIG. 1, the Y axis and the Z axis are orthogonal to the X axis and are also orthogonal to each other. With respect to a Y-axis direction along the Y axis, +Y-axis direction is a direction going from the left side of the sheet surface toward the right side of the sheet surface of FIG. 1; and –Y axis direction is a direction opposite to the +Y-axis direction. With respect to a Z-axis direction along the Z axis, +Z-axis direction is a direction going from the front side of the sheet surface toward the back side of the sheet surface of FIG. 1; and –Z-axis direction is a direction opposite to the +Z-axis direction.

The substrate 110 of the semiconductor device 10 is a semiconductor layer extended along a planar direction defined by the Y axis and the Z axis. According to this embodiment, the substrate 110 is mainly made of gallium nitride (GaN) and contains N-type impurity such as germanium (Ge), oxygen (O) and silicon (Si) as the donor at a higher concentration than the N-type semiconductor layer 120. The description of "being mainly made of gallium nitride (GaN)" means containing 90% or more of gallium nitride (GaN) at the molar fraction.

The N-type semiconductor layer 120 of the semiconductor device 10 is a semiconductor layer stacked on the +X-axis direction side of the substrate 110 and extended along the planar direction defined by the Y axis and the Z axis. The N-type semiconductor layer 120 is mainly made of gallium nitride (GaN) and contains silicon (Si) as the donor at a lower concentration than the N-type semiconductor layer 140. The N-type semiconductor layer 120 is also called "n⁻-GaN".

The P-type semiconductor layer 130 of the semiconductor device 10 is a semiconductor layer stacked on the +X-axis direction side of the N-type semiconductor layer 120 and extended along the planar direction defined by the Y axis and the Z axis. The P-type semiconductor layer 130 is mainly made of gallium nitride (GaN) and contains magnesium (Mg) as the P-type impurity. The P-type semiconductor layer 130 is also called "p-GaN".

The N-type semiconductor layer 140 of the semiconductor device 10 is a semiconductor layer stacked on the +X-axis direction side of the P-type semiconductor layer 130 and extended along the planar direction defined by the Y axis and the Z axis. The N-type semiconductor layer 140 is mainly made of gallium nitride (GaN) and contains silicon (Si) as the donor at a higher concentration than the N-type semiconductor layer 120. The N-type semiconductor layer 140 is also called "n⁺-GaN".

The concavity 182 of the semiconductor device 10 is an area formed by dry etching from the +X-axis direction side of the N-type semiconductor layer 140 to make the P-type semiconductor layer 130 exposed. The concavity 182 has a plane in the thickness direction of the P-type semiconductor layer. The concavity 182 is also called "recess". The concavity 182 is concave to the P-type semiconductor layer 130 in FIG. 1 but may not be necessarily concave in this manner. In other words, it is only required that the plane in the thickness direction of the P-type semiconductor layer is exposed on the +X-axis direction side.

The plane of the P-type semiconductor layer 130 exposed by dry etching is preferably c plane. This effectively removes hydrogen atom (H) in the P-type semiconductor layer 130 and thereby sufficiently enhances the hole concentration of the P-type semiconductor layer 130.

A width Q of a portion of the P-type semiconductor layer 130 exposed by dry etching is preferably not less than 1 μm. This effectively removes hydrogen atom in the P-type semiconductor layer 130. The width Q herein denotes a distance of the portion where the P-type semiconductor layer 130 is exposed on a plane perpendicular to the X-axis direction.

In terms of effectively removing hydrogen atom in the P-type semiconductor layer 130, it is preferable to set the width Q to not less than 1% of a half pitch R of the semiconductor device 10. The half pitch R herein denotes a half distance of the sum of a line width and a line interval. In FIG. 1, the half pitch R is a distance in the Y-axis direction between a center axis of the concavity 182 and a center axis of the concavity 184. The half pitch R is preferably not greater than 10 µm.

After dry etching, the P-type semiconductor layer 130 is subjected to anneal treatment (activation annealing treatment). This reduces an H/Mg ratio over the whole area of the P-type semiconductor layer 130 to not higher than 65% which is required to provide the electrical properties as the P-type semiconductor layer. The H/Mg ratio denotes a ratio of the average concentration of hydrogen atom (H) to the average concentration of magnesium (Mg) in the P-type semiconductor layer 130. In terms of sufficiently enhancing the hole concentration of the P-type semiconductor layer 130, the lower concentration of hydrogen atom in the P-type semiconductor layer 130 is better. Accordingly, it is more preferable that the H/Mg ratio is not higher than 40%.

The concavity 184 of the semiconductor device 10 is an area formed by dry etching to be concave from the +X-axis direction side of the N-type semiconductor layer 140 through the P-type semiconductor layer 130 to the N-type semiconductor layer 120. The concavity 184 is also called trench. According to this embodiment, the concavity 184 is located on the +Y-axis direction side of the concavity 182.

The insulating film 340 is formed on the surface of the concavity 184 to the +X-axis direction side of the N-type semiconductor layer 140. According to this embodiment, the insulating film 340 is made of silicon dioxide ($SiO_2$).

The concavity 186 of the semiconductor device 10 is an area formed by dry etching to be concave from the +X-axis direction side of the N-type semiconductor layer 140 through the P-type semiconductor layer 130 to the N-type semiconductor layer 120. The concavity 186 is also called trench. According to this embodiment, the concavity 186 is located on the −Y-axis direction side of the concavity 184.

The electrode 210 of the semiconductor device 10 is a drain electrode formed on the −X-axis direction side of the substrate 110. According to this embodiment, the electrode 210 is formed by stacking a layer made of aluminum (Al) on a layer made of titanium (Ti) and annealing the layered structure.

The electrode 230 of the semiconductor device 10 is a body electrode formed on the P-type semiconductor layer 130 exposed inside of the concavity 182. According to this embodiment, the electrode 230 is formed by stacking a layer made of gold (Au) on a layer made of nickel (Ni) and annealing the layered structure.

The electrode 240 of the semiconductor device 10 is a source electrode formed on the +X-axis direction side of the N-type semiconductor layer 140 to be located between the concavity 182 and the concavity 184. According to this embodiment, the electrode 240 is formed by stacking a layer made of aluminum (Al) on a layer made of titanium (Ti) and annealing the layered structure.

The electrode 250 of the semiconductor device 10 is a gate electrode formed on the insulating film 340 in the concavity 184. According to this embodiment, the electrode 250 is made of aluminum (Al).

Figure 2:
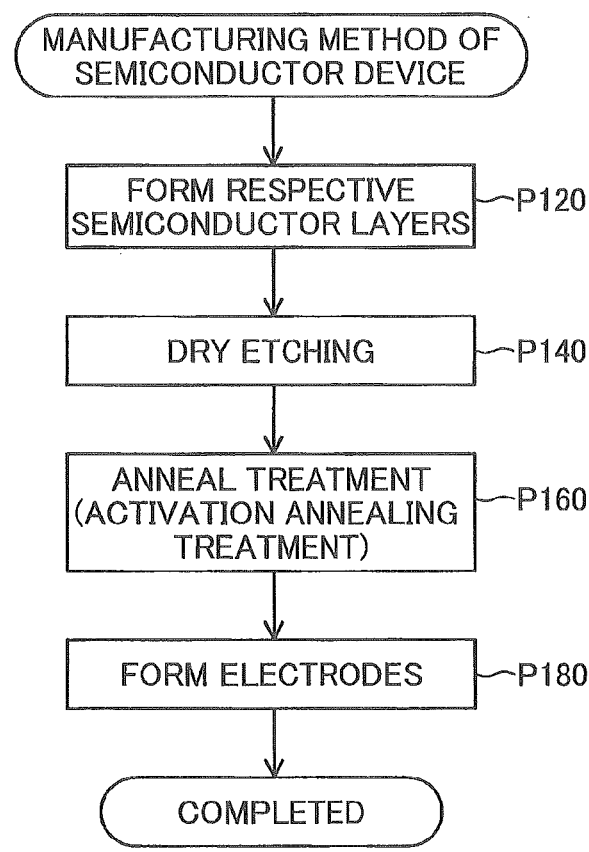
FIG. 2 is a flowchart showing a manufacturing method of the semiconductor device.

FIG. 2 is a flowchart showing a manufacturing method of the semiconductor device 10. In manufacture of the semiconductor device 10, the manufacturer first forms the N-type semiconductor layer 120, the P-type semiconductor layer 130 and the N-type semiconductor layer 140 sequentially on the substrate 110 (process P120). The manufacturer accordingly obtains an intermediate product of the semiconductor device 10 having the respective semiconductor layers formed on the substrate 110. According to this embodiment, the manufacturer forms the respective semiconductor layers on the substrate 110 by using an MOCVD device for metal organic chemical vapor deposition (MOCVD).

After forming the respective semiconductor layers (process P120), the manufacturer performs a dry etching process (process P140). In the dry etching process (process P140), dry etching goes through the N-type semiconductor layer 140 in the thickness direction to make a surface in the thickness direction of the P-type semiconductor layer 130 exposed. More specifically, the manufacturer makes the intermediate product of the semiconductor device 10 subject to dry etching, so as to form the concavity 182. According to this embodiment, the manufacturer forms the concavity 184 and the concavity 186, as well as the concavity 182 by dry etching According to this embodiment, dry etching performed in the dry etching process (process P140) processes the intermediate product of the semiconductor device 10 in an atmosphere containing at least one of chlorine ($Cl_2$) and chlorides (for example, boron chloride ($BCl_3$) and silicon chloride ($SiCl_4$)). According to this embodiment, dry etching performed in the dry etching process (process P140) is inductively coupled plasma (ICP) dry etching.

After the dry etching process (process P140), the manufacturer performs a annealing (activation annealing) process (process P160). In the annealing process (process P160), the manufacturer makes the intermediate product of the semiconductor device 10 subject to anneal treatment (activation annealing treatment) in a gas containing oxygen ($O_2$). This causes hydrogen atom (H) to be released from the P-type semiconductor layer 130 and thereby activates magnesium (Mg) as the acceptor in the P-type semiconductor layer 130.

The temperature of the gas used in the annealing process (process P160) (activation annealing temperature) is preferably not lower than 700° C. and is more preferably not lower than 800° C. The temperature of the gas used in the annealing process is, on the other hand, preferably not higher than 1000° C. and is more preferably not higher than 900° C. This temperature range enhances the hole concentration, while reducing the manufacturing cost.

According to this embodiment, the gas used in the annealing process (process P160) is mainly composed of oxygen ($O_2$) and nitrogen ($N_2$). A ratio of the flow rate of oxygen ($O_2$) to the flow rate of nitrogen ($N_2$) ($O_2/N_2$ flow ratio) of the gas used in the annealing process (process P160) is preferably not lower than 1%, is more preferably not lower than 2% and is furthermore preferably not lower than 5%. Inclusion of oxygen in the gas used in the annealing process effectively increases the hole concentration.

According to this embodiment, the time of annealing the intermediate product of the semiconductor device 10 (activation annealing time) in the annealing process (process P160) is preferably set to not shorter than 5 minutes and not longer than 60 minutes. This time range enhances the hole concentration, while reducing the manufacturing cost.

After the annealing process (process P160), the manufacturer forms the electrode 230 in the concavity 182 in the intermediate product of the semiconductor device 10 (process P180). According to this embodiment, the manufacturer forms the electrodes 210, 240 and 250 and the insulating film 340, as well as the electrode 230. The semiconductor device 10 is completed by this series of processes.

The structure of the first embodiment described above can sufficiently enhance the hole concentration of the P-type semiconductor layer 130 without roughing the surfaces of the P-type semiconductor layer 130 and the N-type semiconductor layer 140. As a result, this improves the electrical properties of the P-type semiconductor layer 130 which has been subjected to dry etching, in the GaN-based semiconductor device 10.

B. Performance Evaluation

B1. First Evaluation Test

Figure 3:
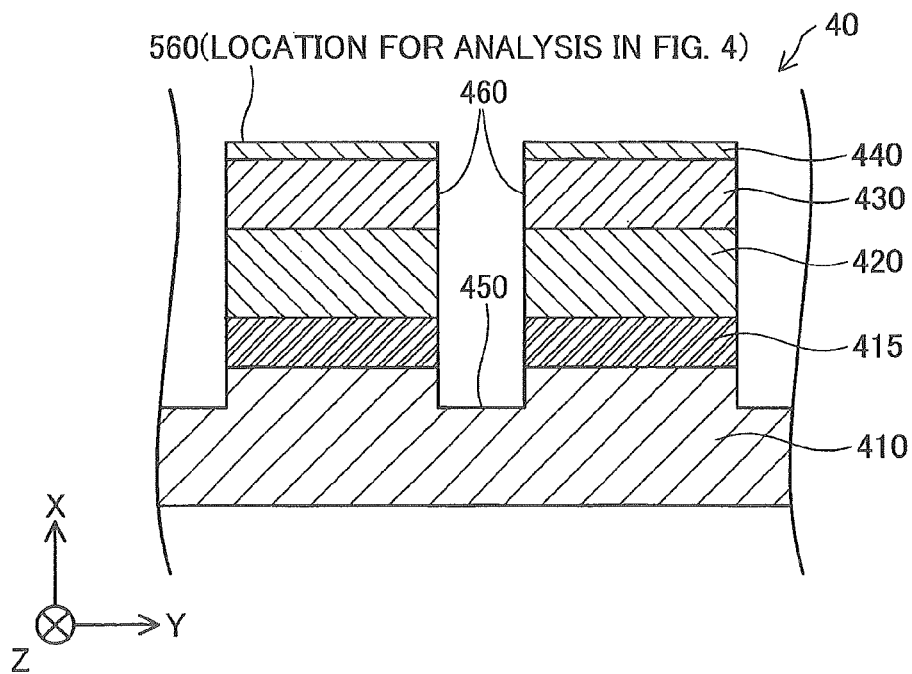
FIG. 3 is a cross sectional view schematically illustrating the structure of a sample used for an evaluation test.

FIG. 3 is a cross sectional view schematically illustrating a sample 40 used for an evaluation test. FIG. 3 shows the XYZ axes like FIG. 1. The sample 40 includes a substrate 410, a buffer layer 415, an undoped semiconductor layer 420, a P-type semiconductor layer 430 and an N-type semiconductor layer 440 formed in this sequence.

The buffer layer 415, the undoped semiconductor layer 420, the P-type semiconductor layer 430 and the N-type semiconductor layer 440 are semiconductor layers formed by crystal growth according to MOCVD.

The substrate 410 of the sample 40 is a semiconductor layer extended along the planar direction defined by the Y axis and the Z axis. The substrate 410 is made of single crystal sapphire.

The buffer layer 415 of the sample 40 is a semiconductor layer stacked on the +X-axis direction side of the substrate 410 and extended along the planar direction defined by the Y axis and the Z axis. The buffer layer 415 is made of aluminum nitride (AlN). The buffer layer 415 has a film thickness of 0.2 μm.

The undoped semiconductor layer 420 of the sample 40 is a semiconductor layer stacked on the +X-axis direction side of the buffer layer 415 and extended along the planar direction defined by the Y axis and the Z axis. The undoped semiconductor layer 420 is an intrinsic semiconductor layer mainly made of GaN. The undoped semiconductor layer 420 has a film thickness of 2 μm.

The P-type semiconductor layer 430 of the sample 40 is a semiconductor layer stacked on the +X-axis direction side of the undoped semiconductor layer 420 and extended along the planar direction defined by the Y axis and the Z axis. The P-type semiconductor layer 430 is mainly made of GaN and contains Mg as the acceptor. The P-type semiconductor layer 430 has an Mg concentration of $2\times10^{19}/cm^3$ and a film thickness of 0.7 μm.

The N-type semiconductor layer 440 of the sample 40 is a semiconductor layer stacked on the +X-axis direction side of the P-type semiconductor layer 430 and extended along the planar direction defined by the Y axis and the Z axis. The N-type semiconductor layer 440 is mainly made of GaN and contains Si as the donor. The N-type semiconductor layer 440 has an Si concentration of $3\times10^{18}/cm^3$ and a film thickness of 0.2 μm.

The sample 40 has been subjected to dry etching, such as to make only a side wall 460 of the P-type semiconductor layer 430 exposed. This dry etching also makes a plane 450 of the substrate 410 exposed. A plane of the N-type semiconductor layer 440 which has not been subjected to dry etching is hereinafter called plane 560.

Figure 4:
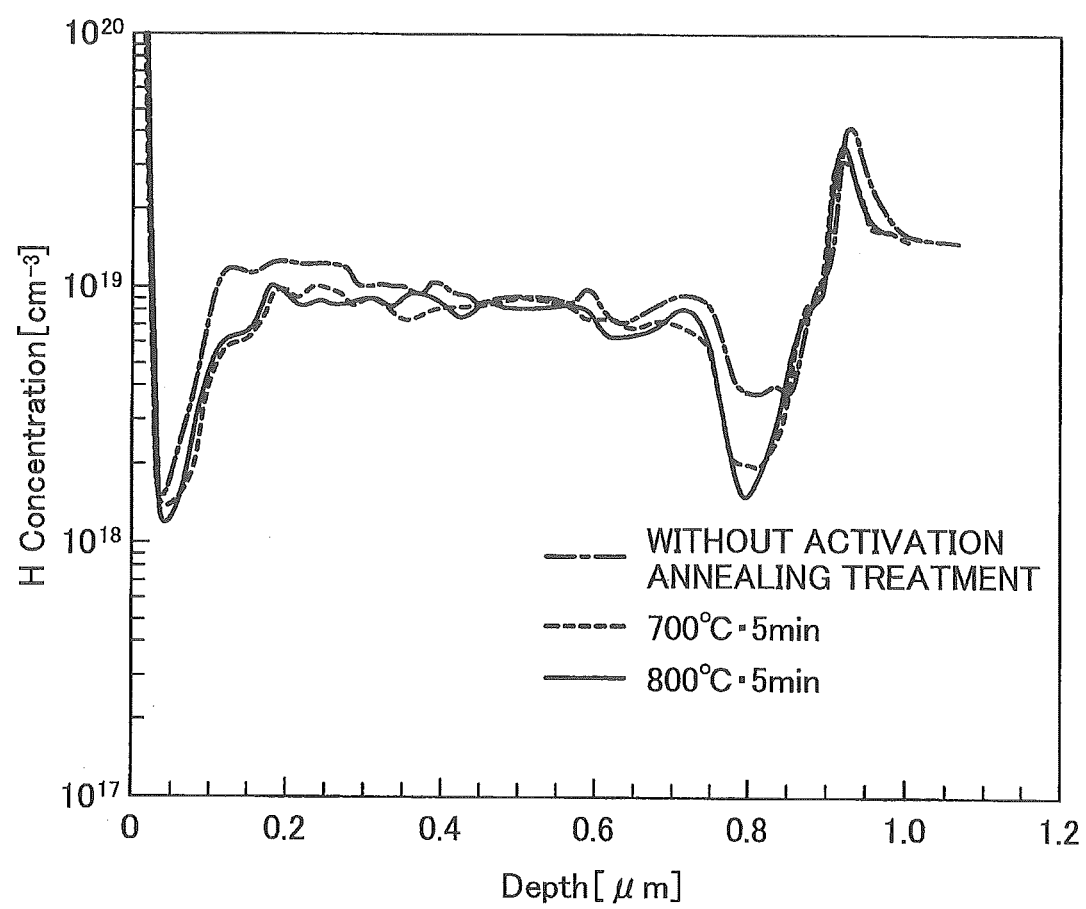
FIG. 4 is a graph showing a relationship between the depth and H concentration.

FIG. 4 is a graph showing a relationship between the depth and H concentration. These results were obtained by secondary ion mass spectrometry (SIMS). The graph has the H concentration ($/cm^3$) as the ordinate and the depth (μm) in the −X-axis direction as the abscissa on the assumption that the plane 560 of the N-type semiconductor layer 440 (see FIG. 3) is set to the depth of 0.

In the first evaluation test, the examiner produced a sample 40 without performing the activation annealing process after dry etching and samples 40 with performing the activation annealing process after dry etching and measured the H concentration in the depth direction of the semiconductor device with respect to each of these produced samples 40. Two different conditions were employed for the activation annealing process: anneal treatment of 700° C. for 5 minutes and anneal treatment of 800° C. for 5 minutes.

The results of the first evaluation test show that there is no substantial difference in H concentration from the depth of about 0.2 μm to about 0.9 μm, which corresponds to the P-type semiconductor layer 430, irrespective of with or without performing the activation annealing process. More specifically, these results show that etching to make only the side surface (Y-axis direction surface) of the P-type semiconductor layer 430 exposed does not allow for effective removal of H by the subsequent annealing process. This results in insufficient enhancement of the hole concentration of the P-type semiconductor layer 430.

B2. Second Evaluation Test

Figure 5:
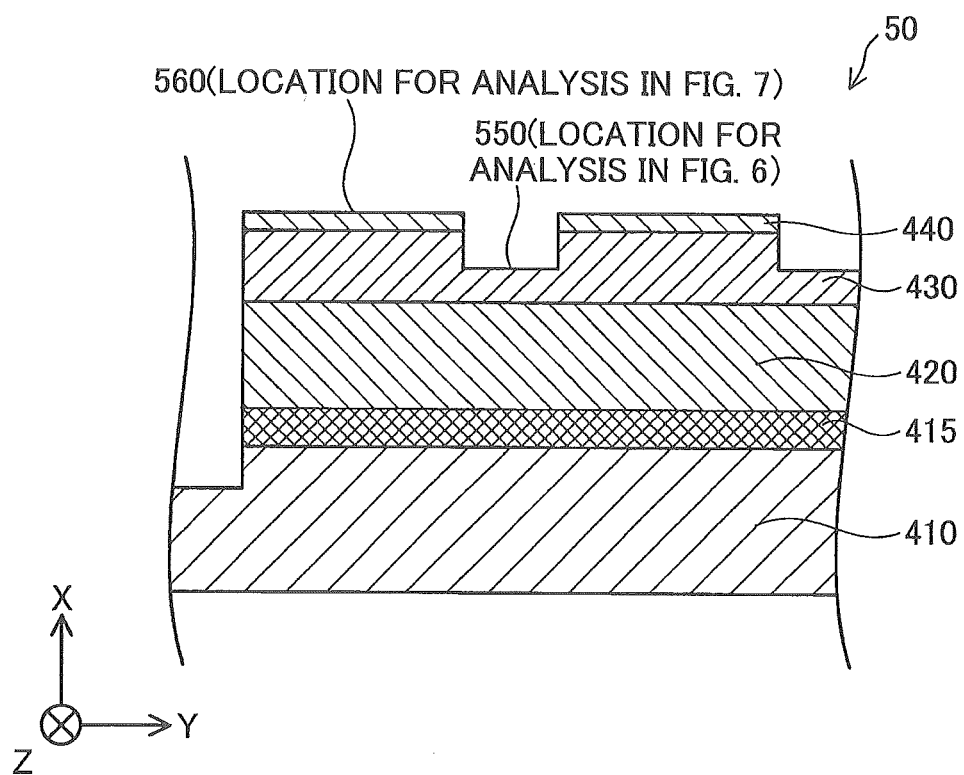
FIG. 5 is a cross sectional view schematically illustrating the structure of another sample used for a second evaluation test.

FIG. 5 is a cross sectional view schematically illustrating the structure of another sample 50 used for a second evaluation test. FIG. 5 shows the YXZ axes, like FIGS. 1 and 3. The sample 50 differs from the sample 40 by dry etching performed to make the P-type semiconductor layer 430 exposed. Otherwise the structure of the sample 50 is similar to the structure of the sample 40. In other words, the sample 50 has been subjected to dry etching to make a plane of the P-type semiconductor layer 430 (plane crossing the X-axis direction, also called plane 550) exposed.

In the second evaluation test, the examiner produced a sample 50 without performing the activation annealing process after dry etching and samples 50 with performing the activation annealing process after dry etching and measured the H concentration in the depth direction of the semiconductor device with respect to each of these produced samples 50. Three different conditions were employed for the activation annealing process: anneal treatment of 800° C. for 5 minutes, anneal treatment of 800° C. for 30 minutes and anneal treatment of 900° C. for 30 minutes.

FIG. 6 is a graph showing a relationship between the depth and H concentration. These results were also obtained by SIMS (the same applies to the results of FIG. 7). The graph has the H concentration ($/cm^3$) as the ordinate and the depth (μm) in the −X-axis direction as the abscissa on the assumption that the plane 550 of the P-type semiconductor layer 430 is set to the depth of 0.

FIG. 7 is a graph showing a relationship between the depth and H concentration. The graph has the H concentration ($/cm^3$) as the ordinate and the depth (μm) in the −X-axis direction as the abscissa on the assumption that the plane 560 of the N-type semiconductor layer 440 is set to the depth of 0.

FIG. 7 shows the relationship between the depth and H concentration under the condition without performing the dry etching process. FIG. 6 shows the relationship between the depth and H concentration under the condition that the plane 550 of the P-type semiconductor layer 430 is exposed by the dry etching process.

According to the results of the second evaluation test, compared with the location where the P-type semiconductor layer 430 is not exposed (FIG. 7), the location where the P-type semiconductor layer 430 is exposed has a more effective decrease in H concentration by the annealing process. Especially, the anneal treatment of 900° C. for 30 minutes after exposure of the P-type semiconductor layer 430 provides a more effective decrease of the H concentration (FIG. 6). While the H concentration has no substantial decrease in the first evaluation test, the H concentration in the P-type semiconductor layer 430 has a decrease in the second evaluation test. The reason for a large fluctuation of the H concentration in the result of the anneal treatment of 900° C. for 30 minutes is attributed to the test condition having the detection limit set to $2\times10^{17}/cm^3$.

C. Modifications

The invention is not limited to the above embodiment, but a multiplicity of variations and modifications may be made to the embodiment without departing from the scope of the invention. Some examples of possible modification are given below.

C1. Modification 1

The embodiment uses silicon (Si) as the donor included in at least one of the substrate and the N-type semiconductor layer, but the invention is not limited to this donor. The donor may be, for example, germanium (Ge) or oxygen (O).

C2. Modification 2

The embodiment uses magnesium (Mg) as the acceptor included in the P-type semiconductor layer, but the invention is not limited to this acceptor. The acceptor may be, for example, zinc (Zn) or carbon (C).

C3. Modification 3

The embodiment uses gallium nitride which is a group III nitride, as the semiconductor, but the invention is not limited to this semiconductor. The semiconductor may be, for example, another group III nitride, such as aluminum nitride or indium nitride, silicon, gallium arsenide or silicon carbide.

The invention is not limited to any of the embodiment and the modifications described herein but may be implemented by a diversity of other configurations without departing from the scope of the invention. For example, the technical features of the embodiment and modifications corresponding to the technical features of the respective aspects described in Summary may be replaced or combined appropriately, in order to solve part or all of the problems described above or in order to achieve part or all of the advantageous effects described above. Any of the technical features may be omitted appropriately unless the technical feature is described as essential herein.

The invention claimed is:

1. A manufacturing method of a semiconductor device having an N-type semiconductor layer on a P-type semiconductor layer, the manufacturing method comprising:
   a dry etching process of performing dry etching to go through the N-type semiconductor layer in a thickness direction in order to expose a surface of the P-type semiconductor layer; and
   an annealing process of annealing the P-type semiconductor layer in an atmosphere comprising oxygen, after the dry etching process,
   wherein a width of the P-type semiconductor layer exposed by the dry etching process is not less than 1% of a half pitch of the semiconductor device.

2. The manufacturing method of the semiconductor device according to claim 1, wherein the P-type semiconductor layer and the N-type semiconductor layer are mainly made of gallium nitride.

3. The manufacturing method of the semiconductor device according to claim 1, wherein a width of the P-type semiconductor layer exposed by the dry etching process is not less than 1 µm.

4. The manufacturing method of the semiconductor device according to claim 1, wherein the half pitch of the semiconductor device is not greater than 10 µm.

5. The manufacturing method of the semiconductor device according to claim 1, wherein the annealing process has an annealing temperature of not lower than 800° C. and an a annealing time of not shorter than 5 minutes and not longer than 60 minutes.

6. The manufacturing method of the semiconductor device according to claim 1, wherein the surface of the P-type semiconductor layer exposed by the dry etching process comprises a c plane.

7. The manufacturing method of the semiconductor device according to claim 1, further comprising:
   forming the P-type semiconductor layer and the N-type semiconductor layer by metal organic chemical vapor deposition (MOCVD).

8. The manufacturing method of the semiconductor device according to claim 1, wherein a molar fraction of gallium nitride in the P-type semiconductor layer and the N-type semiconductor layer is 90% or greater.

9. The manufacturing method of the semiconductor device according to claim 1, wherein the performing of the dry etching comprises forming a plurality of recesses in the N-type semiconductor layer, the surface of the P-type semiconductor layer being exposed through a first recess of the plurality of recesses.

10. The manufacturing method of the semiconductor device according to claim 9, further comprising:
    forming an other N-type semiconductor layer on a substrate, the P-type semiconductor layer being formed on the other N-type semiconductor layer,
    wherein a second recess of the plurality of recesses comprises a trench having a bottom which is formed in the other N-type semiconductor layer.

11. The manufacturing method of the semiconductor device according to claim 10, further comprising:
    forming a body electrode on the surface of the P-type semiconductor layer in the first recess;
    forming a drain electrode on a surface of the substrate which is opposite the other N-type semiconductor layer;
    forming a source electrode on the N-type semiconductor layer between the first recess and the second recess; and
    forming a gate electrode on the insulating film in the trench.

12. The manufacturing method of the semiconductor device according to claim 1, wherein the performing of the dry etching comprises performing inductively coupled plasma (ICP) dry etching of the semiconductor device in an atmosphere comprising at least one of chlorine and chlorides.

13. The manufacturing method of the semiconductor device according to claim 1, wherein the annealing of the P-type semiconductor layer comprises annealing the P-type semiconductor layer in a gas comprising oxygen and nitrogen, a temperature of the gas is not greater than 1000° C., and a ratio of a flow rate of oxygen to a flow rate of nitrogen of the gas is not less than 1%.

14. A method of manufacturing a semiconductor device, comprising:
    forming a first N-type semiconductor layer on substrate;
    forming a P-type semiconductor layer on the first N-type semiconductor layer;
    forming a second N-type semiconductor layer on the P-type semiconductor layer;
    performing a dry etching of the second N-type semiconductor layer to form a plurality of recesses in the N-type semiconductor layer, the surface of the P-type semiconductor layer being exposed through a first recess of the plurality of recesses; and
    after the performing of the drying etching, annealing the P-type semiconductor layer in an atmosphere comprising oxygen, wherein a width of the surface of the P-type semiconductor layer exposed by the dry etching is not less than 1% of a half pitch of the semiconductor device, the half pitch comprising a distance between a center axis of a first recess and a center axis of a second recess of the plurality of recesses.

* * * * *